(12) United States Patent
Yu et al.

(10) Patent No.: US 12,412,862 B2
(45) Date of Patent: Sep. 9, 2025

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Chi-Yang Yu, Taoyuan (TW); Nien-Fang Wu, Chiayi (TW); Hai-Ming Chen, Kaohsiung (TW); Yu-Min Liang, Taoyuan (TW); Jiun-Yi Wu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 843 days.

(21) Appl. No.: 17/460,273

(22) Filed: Aug. 29, 2021

(65) Prior Publication Data
US 2022/0352109 A1    Nov. 3, 2022

Related U.S. Application Data

(60) Provisional application No. 63/181,128, filed on Apr. 28, 2021.

(51) Int. Cl.
*H01L 23/00* (2006.01)
*H01L 21/48* (2006.01)
(Continued)

(52) U.S. Cl.
CPC .......... *H01L 24/32* (2013.01); *H01L 21/4857* (2013.01); *H01L 23/49816* (2013.01);
(Continued)

(58) Field of Classification Search
None
See application file for complete search history.

(56) References Cited

U.S. PATENT DOCUMENTS 9,000,584 B2    4/2015 Lin et al.
9,048,222 B2    6/2015 Hung et al.
(Continued)

FOREIGN PATENT DOCUMENTS

TW    201906124    2/2019

OTHER PUBLICATIONS

"Office Action of Taiwan Counterpart Application", issued on Feb. 4, 2025, p. 1-p. 5.

*Primary Examiner* — Telly D Green
(74) *Attorney, Agent, or Firm* — JCIPRNET

(57) ABSTRACT

A semiconductor package and a manufacturing method for the semiconductor package are provided. The semiconductor package includes a redistribution layer, a semiconductor die, conducting connectors, dummy bumps and an underfill. The semiconductor die is disposed on a top surface of the redistribution layer and electrically connected with the redistribution layer. The conducting connectors are disposed between the semiconductor die and the redistribution layer, and are physically and electrically connected with the semiconductor die and the redistribution layer. The dummy bumps are disposed on the top surface of the redistribution layer, beside the conducting connectors and under the semiconductor die. The underfill is disposed between the semiconductor die and the redistribution layer and sandwiched between the dummy bumps and the semiconductor die. The dummy bumps are electrically floating. The dummy bumps are in contact with the underfill without contacting the semiconductor die.

20 Claims, 12 Drawing Sheets

(51) Int. Cl.
  *H01L 23/498* (2006.01)
  *H01L 25/00* (2006.01)
  *H01L 25/065* (2023.01)

(52) U.S. Cl.
  CPC .............. *H01L 24/16* (2013.01); *H01L 24/73* (2013.01); *H01L 24/81* (2013.01); *H01L 24/83* (2013.01); *H01L 25/0655* (2013.01); *H01L 25/50* (2013.01); H01L 2224/16227 (2013.01); H01L 2224/32225 (2013.01); H01L 2224/73204 (2013.01); H01L 2224/81192 (2013.01); H01L 2924/37001 (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,847,485 B2* | 11/2020 | Huang | H01L 24/17 |
| 2011/0266693 A1* | 11/2011 | Simmons-Matthews | H01L 21/561 257/E21.705 |
| 2015/0255426 A1* | 9/2015 | Son | H01L 23/5385 257/738 |
| 2016/0300773 A1 | 10/2016 | Lee et al. | |
| 2018/0138101 A1* | 5/2018 | Yu | H01L 23/481 |
| 2019/0164860 A1* | 5/2019 | Lin | H01L 24/17 |
| 2019/0237412 A1* | 8/2019 | Lee | H01L 25/0655 |
| 2020/0203299 A1* | 6/2020 | Huang | H01L 24/94 |
| 2020/0203300 A1* | 6/2020 | Huang | H01L 24/06 |
| 2021/0066230 A1* | 3/2021 | Huang | H01L 24/16 |
| 2022/0052009 A1* | 2/2022 | Huang | H01L 25/0655 |
| 2022/0262751 A1* | 8/2022 | Zhang | H01L 25/0652 |

* cited by examiner

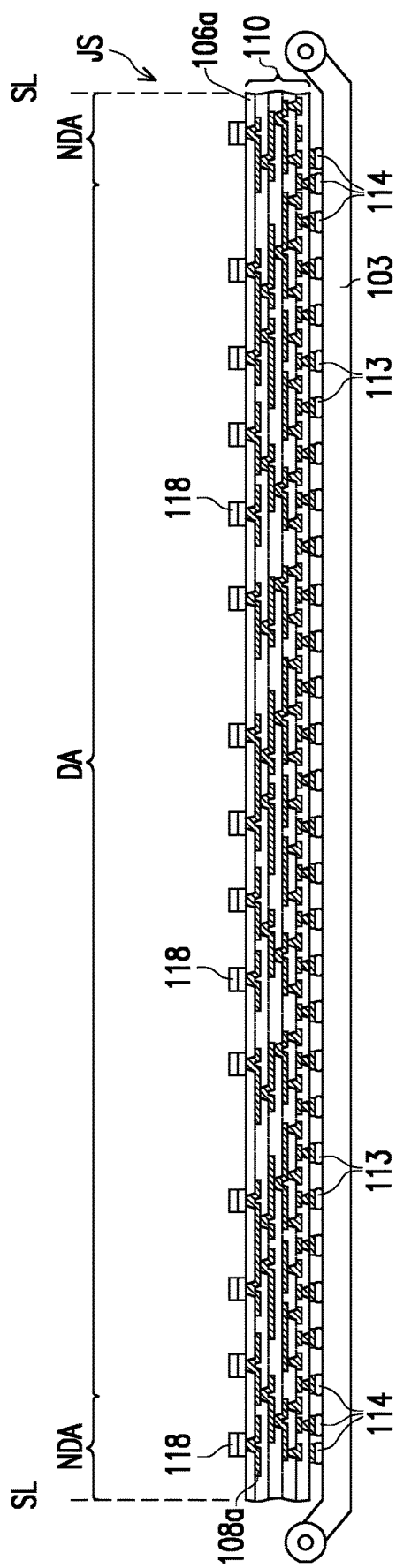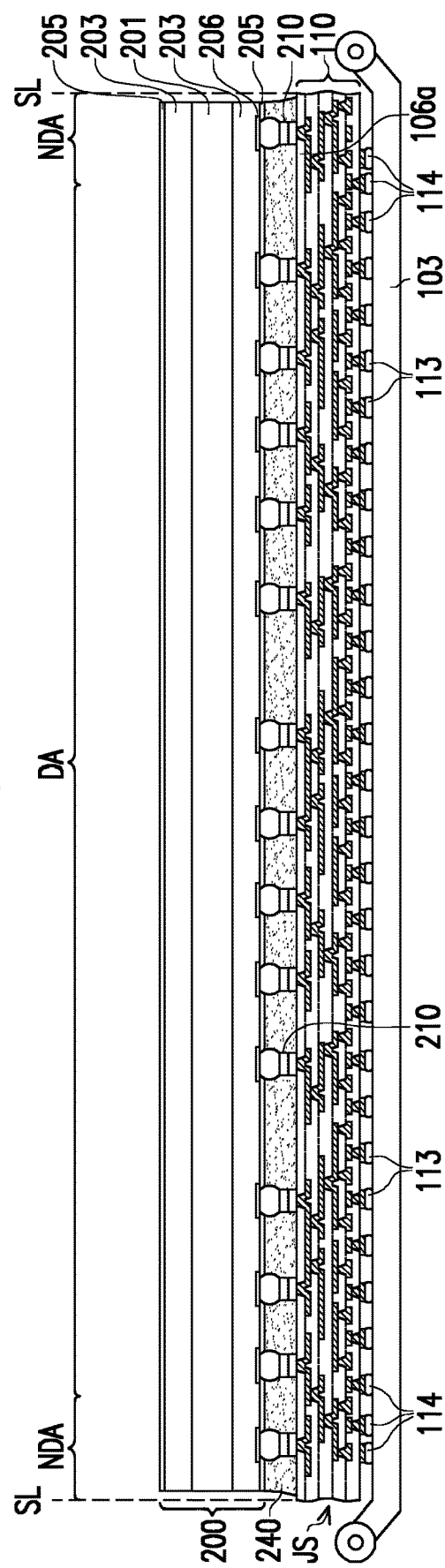

PACKAGE STRUCTURE AND MANUFACTURING METHOD THEREOF

CROSS-REFERENCE TO RELATED APPLICATION

This application claims the priority benefit of U.S. provisional application Ser. No. 63/181,128, filed on Apr. 28, 2021. The entirety of the above-mentioned patent application is hereby incorporated by reference herein and made a part of this specification.

BACKGROUND

During the packaging processes of the semiconductor dies, conductive connection structures and metallic routing structures are formed for routing and interconnecting the dies and/or semiconductor devices in the packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 7 are schematic cross-sectional views of various stages in a manufacturing method of a semiconductor package according to some exemplary embodiments of the present disclosure.

DETAILED DESCRIPTION

Figure 1:
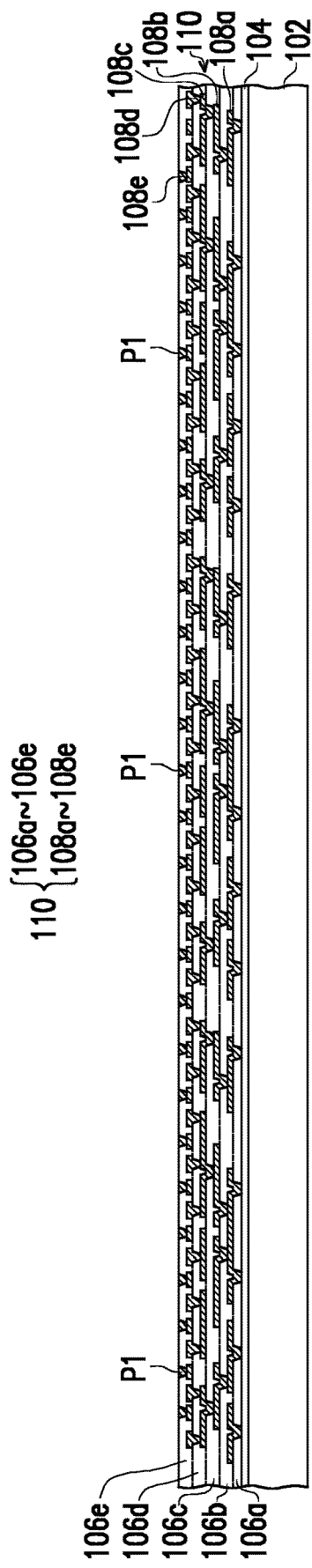

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 9:
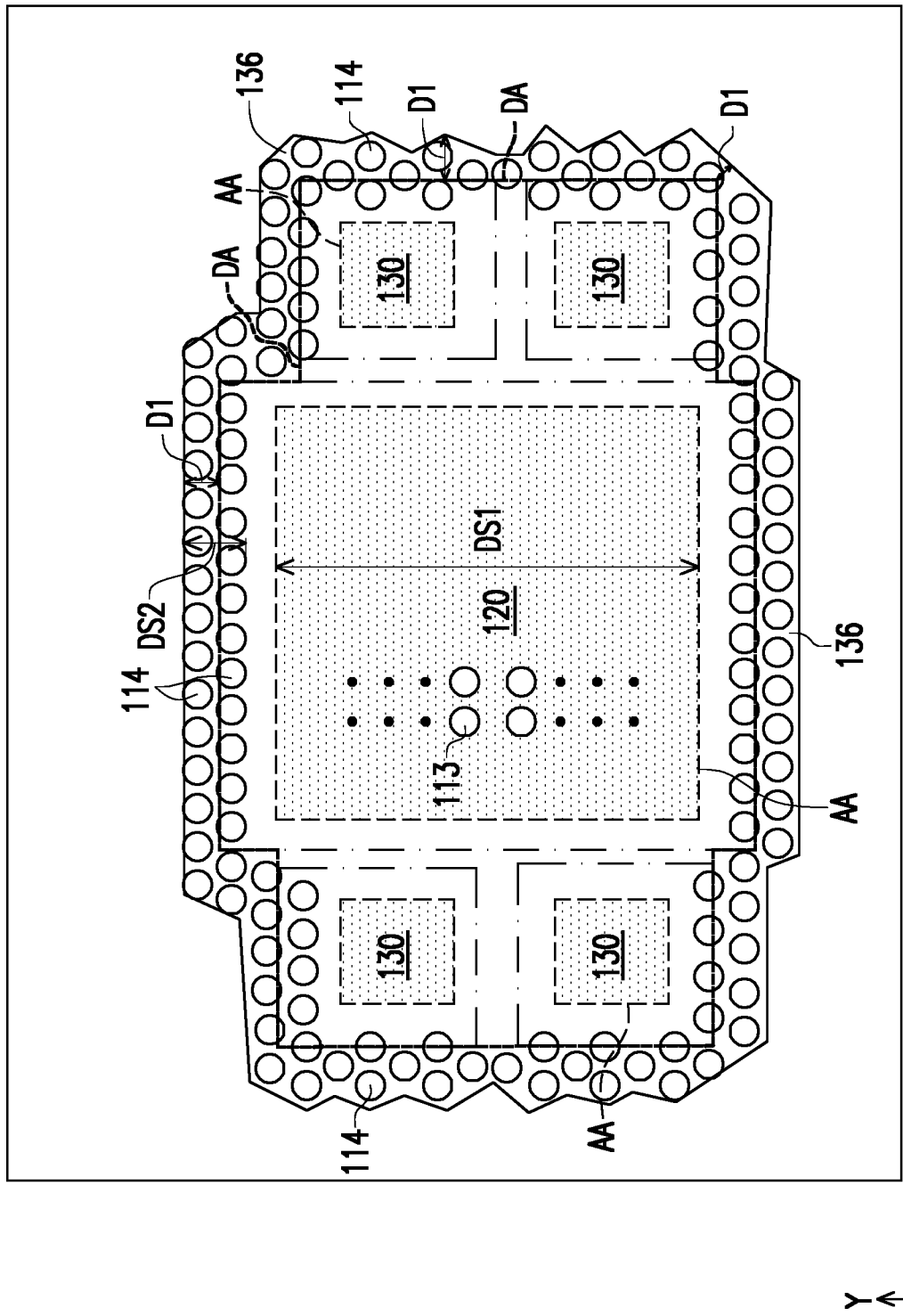
FIG. 9 and FIG. 10 are schematic planar views illustrating the exemplary layout of the dummy bumps in a package structure according to some exemplary embodiments of the present disclosure.
Figure 10:
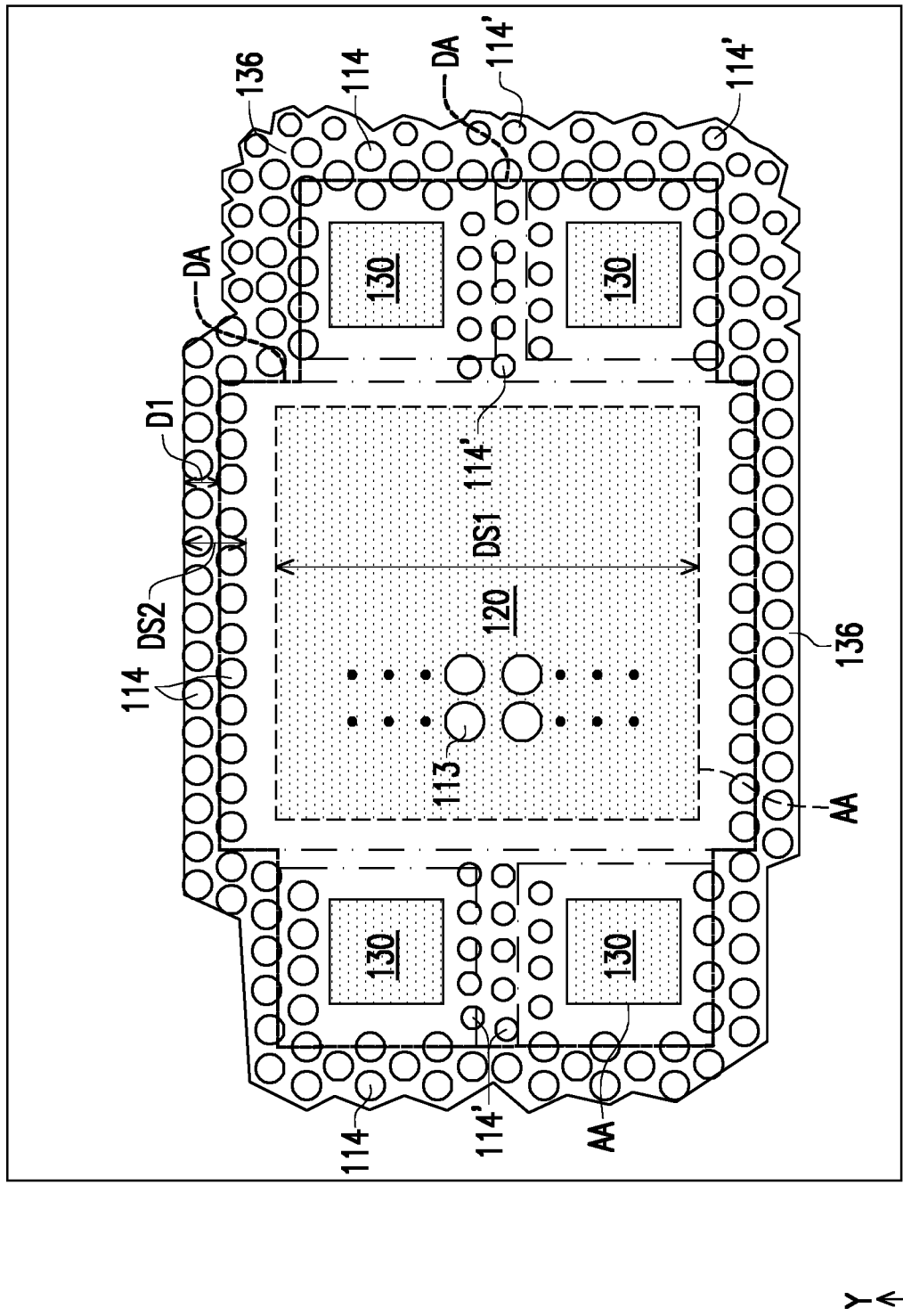

FIG. 1 to FIG. 7 are schematic sectional views of various stages in a method of fabricating a package structure in accordance with some embodiments of the present disclosure. FIG. 9 and FIG. 10 are schematic planar views illustrating the exemplary layout of the dummy bumps in a package structure according to some exemplary embodiments of the present disclosure.

Referring to FIG. 1, a carrier 102 with a debonding layer 104 coated thereon is provided and a redistribution layer 110 is formed over the carrier 102. In some embodiments, the carrier 102 includes any suitable semiconductor carrier for the manufacturing method of the integrated fan-out (InFO) package structure. In some embodiments, the carrier 102 is a glass carrier or a temporary carrier. In some embodiments, the debonding layer 104 is formed from any material suitable for bonding and debonding the carrier 102 from the above layer(s) or any wafer(s) disposed thereon. In some embodiments, the debonding layer 104 includes a light-to-heat-conversion (LTHC) release coating film, possible for room temperature debonding from the carrier 102 by applying laser irradiation. In some embodiments, the debonding layer 104 includes an ultra-violet (UV) glue, which loses its adhesive property when exposed to UV lights. In certain embodiments, the debonding layer 104 may be dispensed as a liquid and cured, or may be a laminate film laminated onto the carrier 102.

Referring to FIG. 1, once the carrier 102 and the debonding layer 104 are provided, a redistribution layer 110 is formed on the debonding layer 104 over the carrier 102. In some embodiments, the redistribution layer 110 includes dielectric layers 106a, 106b, 106c, 106d, 106e and conductive layers 108a, 108b, 108c, 108d, 108e arranged in alternation, and the conductive layers 108a, 108b, 108c, 108d, 108e are sandwiched between the dielectric layers 106a, 106b, 106c, 106d, 106e. For example, the conductive layer 108a may be constituted by a plurality of metallic redistribution patterns. In some embodiments, the formation of the redistribution layer 110 includes forming a layer of a dielectric material (not shown), patterning the layer of dielectric material to form openings, depositing a metallic material filling up the openings to form metallization patterns. Depending on the number of the layers to be formed, these processes may be repeated several times, and the sequentially layers may be denoted based on the formation sequence. In some embodiments, the dielectric layers 106a, 106b, 106c, 106d, 106e further include via openings revealing the underlying layer. In some embodiments, the conductive layers 108a, 108b, 108c, 108d, 108e may include electrically connected routing traces or fan-out traces, some of them are interconnected with one another by the conductive vias. In some embodiments, the topmost conductive layer 108e may include bond pads P1. In some embodiments, the topmost conductive layer 108e also includes other routing traces for interconnecting the bond pads P1. In some embodiments, the bond pads P1 may include under bump metallurgy (UBM) portions.

For simplicity, the dielectric layers 106a, 106b, 106c, 106d, 106e may be regarded as one single dielectric structure and the conductive layers 108a, 108b, 108c, 108d, 108e may be illustrated as conductive redistribution patterns embedded in the dielectric layers. However, from the perspectives of the manufacturing process, the dielectric layers 106a, 106b, 106c, 106d, 106e are formed in sequence as five dielectric layers, and the redistribution conductive layers 108a, 108b, 108c, 108d, 108e are also formed in sequence and each sandwiched between the two adjacent dielectric layers.

In some embodiments, the materials of the conductive layers 108a, 108b, 108c, 108d, 108e include aluminum, titanium, copper, nickel, tungsten, cobalt and/or alloys thereof. The conductive layer 108a, 108b, 108c, 108d, or 108e may be formed by, for example, electroplating, deposition, and/or photolithography and etching. In some embodiments, the conductive layer 108a, 108b, 108c, 108d, or 108e may further optionally includes a seed layer if formed by plating. In some embodiments, the materials of the dielectric layers 106a, 106b, 106c, 106d, 106e include polyimide, epoxy resin, acrylic resin, phenol resin, benzocyclobutene (BCB), polybenzooxazole (PBO), or any other suitable polymer-based dielectric material. The dielectric layer 106a, 106b, 106c, 106d, or 106e, for example, may be formed by suitable fabrication techniques such as spin-on coating, chemical vapor deposition (CVD), plasma-enhanced chemical vapor deposition (PECVD), or the like.

It is noted that the number of the conductive layers and the number of the dielectric layers of the redistribution layer 110 illustrated in FIG. 1 are merely for illustrative purposes, and the disclosure is not limited thereto. In some alternative embodiments, less or more layers of the conductive layers and/or dielectric layers may be formed depending on the design requirement.

Figure 2:
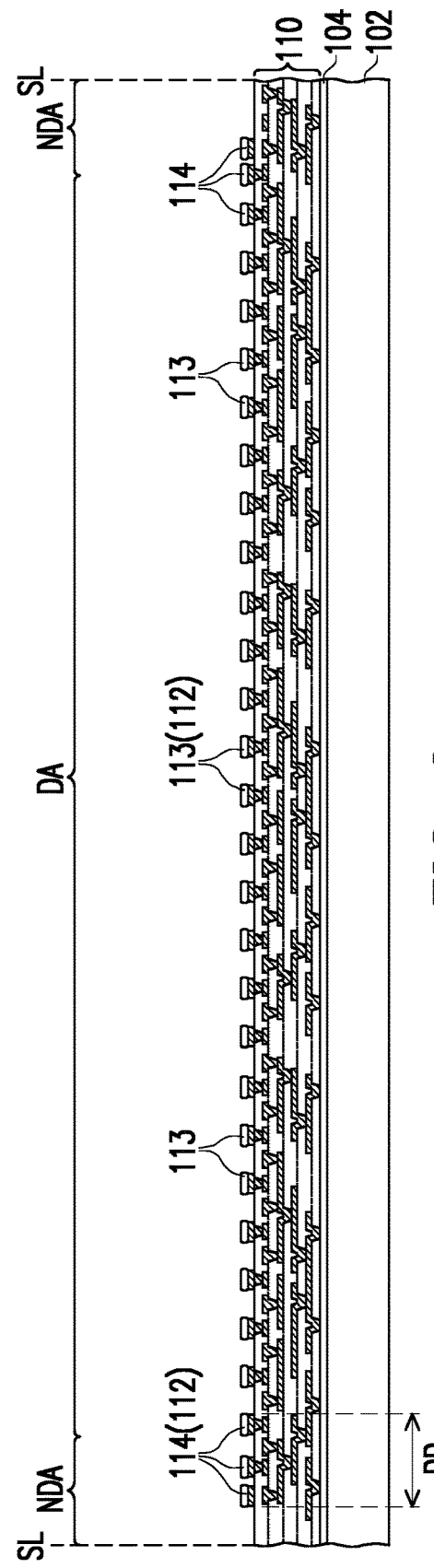

As illustrated in FIG. 2, corresponding to the subsequently mounted semiconductor dies and other later performed processes to the structure, at least one die attaching region DA and at least one non-die attaching region NDA are predetermined and defined. Also, the scribe lanes SL are predetermined and are located within the non-die attaching region(s) NDA.

As illustrated in FIG. 2, after forming the redistribution layer 110, bonding portions 112 are respectively formed on the bond pads P1 of the topmost conductive layer 108e. In one embodiment, some of the bonding portions 112 are formed on the redistribution layer 110 (on the topmost dielectric layer) but not on the bond pads P1. In some embodiments, bonding portions 112 includes conducting bumps 113 located within the die attaching region DA and dummy bumps 114 distributed over the die attaching region DA and the non-die attaching region NDA. In embodiments, the conducting bumps 113 function as active bumps for electrically connecting the redistribution layer 110 with other active semiconductor components or devices. In one embodiment, some of the dummy bumps 114 are not located on the bond pads P1 and are formed on the redistribution layer 110 (on the topmost dielectric layer). In FIG. 2, it is seen that the distribution span DD of the dummy bumps 114 is partially overlapped with the die attaching region DA.

In some embodiments, the conducting bumps 113 include micro-bumps, metallic posts such as copper posts or copper alloy posts, metallic posts with solder materials/solder pastes, or metallic posts with suitable metallic or metal alloy coatings for enhancing bonding, or other suitable metallic connectors. In some embodiments, the dummy bumps 114 include micro-bumps, metallic posts such as copper posts or copper alloy posts, metallic posts with solder materials/solder pastes, or metallic posts with suitable metallic or metal alloy coatings for enhancing bonding, or other suitable metallic connectors. In some embodiments, the bonding portions 112 may be formed through electroplating. In some embodiments, the conducting bumps 113 and the dummy bumps 114 of the bonding portions 112 are formed at the same time through the same electroplating process. In some embodiments, formation of the bonding portions 112 involves forming a seed layer (not shown) by sputtering, forming a mask (not shown), forming metallic posts by electroplating and then etching off the extra seed layer and the mask. In some embodiments, formation of the bonding portions 112 further involves forming a metallic coating on the metallic posts and/or forming solder caps on the metallic posts by printing or plating.

In some embodiments, the materials of the bonding portions 112 include copper, nickel, titanium, cobalt, palladium, titanium, tin, silver, and/or alloys thereof or combinations thereof. In some embodiments, the materials of the conducting bumps 113 are the same as the materials of the dummy bumps 114. In some embodiments, the materials of the conducting bumps 113 are different from the materials of the dummy bumps 114. In some embodiments, the structure of each single conducting bump 113 is the same as the structure of each single dummy bump 114. In some embodiments, the structure of at least one dummy bump 114 is different from the structures of the conducting bumps 113. In some embodiments, the structures of the dummy bumps 114 are different from the structures of the conducting bumps 113.

As the dimension and the pitch of the bumps are continually scaled down, it is important to maintain good uniformity and coplanarity of the formed bumps in the bump array. By forming the dummy bumps surrounding the conducting bumps in the same process, the uniformity and coplanarity of the formed bumps are significantly improved especially for bumps in the peripheral region of the array.

Figure 11D:
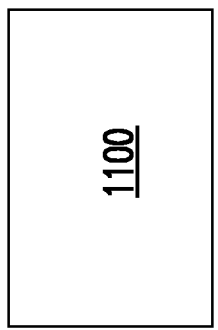
FIG. 11A to FIG. 11D are schematic cross-sectional views illustrating the bump structures according to some embodiments of the present disclosure.
Figure 11C:
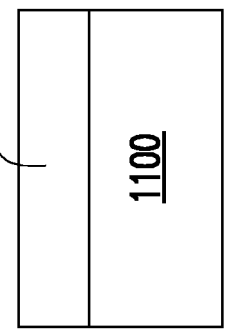
Figure 11B:
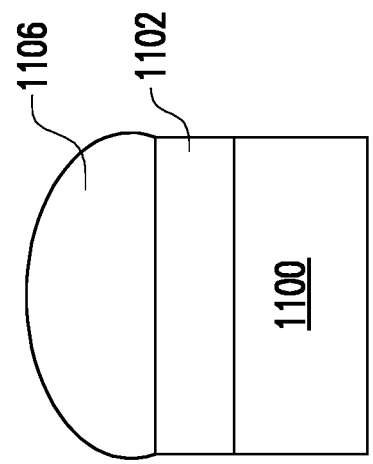

FIG. 11A to FIG. 11D are schematic cross-sectional views illustrating the bump structures of according to some embodiments of the present disclosure. FIG. 12A to FIG. 12C are schematic enlarged partial cross-sectional views showing the dummy bump attached to a portion of a package structure according to some exemplary embodiments of the present disclosure.

Figure 11A:
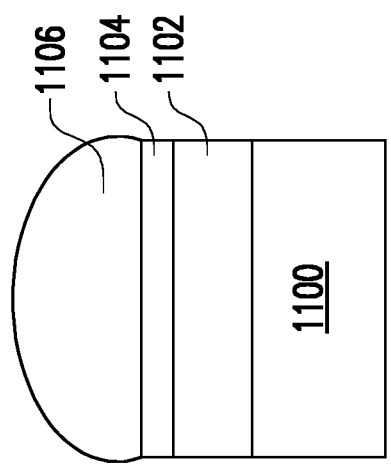
Figure 12C:
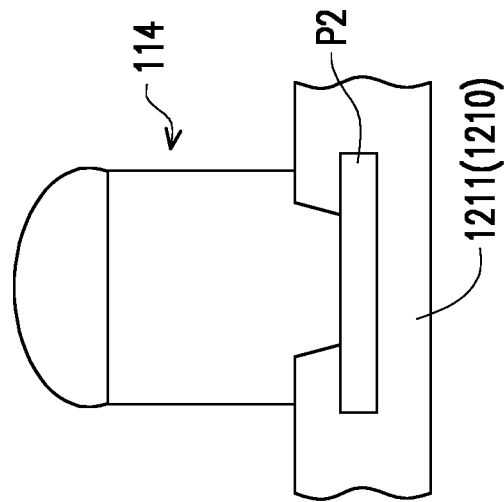
FIG. 12A to FIG. 12C are schematic enlarged partial cross-sectional views showing the dummy bump attached to a portion of a package structure according to some exemplary embodiments of the present disclosure.
Figure 12B:
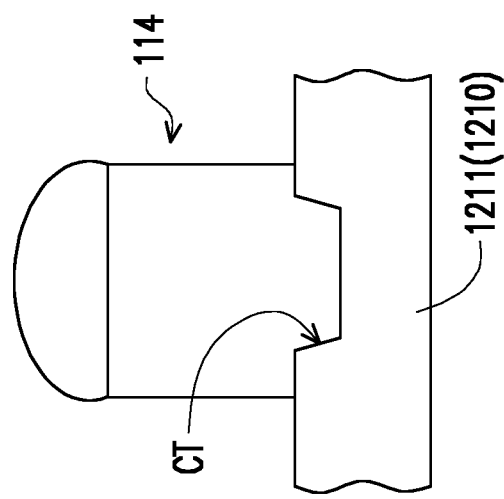
Figure 12A:
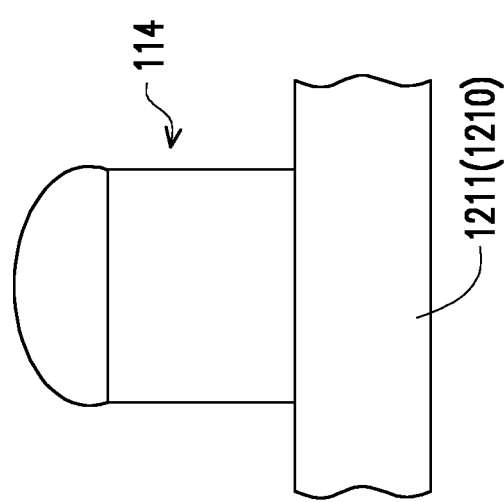

Referring to FIG. 11A, in some embodiments, the bump structure includes a metallic post 1100 and a stack of a first metal layer 1102, a second metal layer 1104 and a solder material 1106 stacked sequentially on the metallic post 1100. Referring to FIG. 11B, in some embodiments, the bump structure includes a metallic post 1100 and a stack of a first metal layer 1102 and a solder material 1106 stacked sequentially on the metallic post 1100. Referring to FIG. 11C and FIG. 11D, in some embodiments, the bump structure includes a metallic post 1100 and a first metal layer 1102 thereon, or the bump structure simply includes a metallic post 110. In some embodiments, a material of the metallic post 1100 includes copper or a copper alloy. In some embodiments, a material of the first metallic layer 1102 includes nickel or a nickel alloy. In some embodiments, a material of the second metallic layer 1104 includes copper or a copper alloy. In some embodiments, a material of the solder material 1106 includes tin, copper, silver, bismuth, indium, zinc, antimony, manganese and/or alloys thereof. As described in the embodiments, the bonding portions 112 may include conducting bumps 113 and dummy bumps 114, and the structures of the bonding portions 112 may include the bumps structures as illustrated in FIGS. 11A-11D. In some embodiments, the conducting bumps 113 are formed with the bump structures as shown in FIG. 11A or FIG. 11B, while the dummy bumps 114 are formed with the bump structures as shown in FIG. 11C or FIG. 11D. For example, the conducting bumps 113 and some or all of the dummy bumps 114 of the bonding portions 112 are formed with metallic posts at the same time through the same electroplating process, and then the conducting bumps 113 are later formed with solder caps to complete the bump structures.

In some embodiments, referring to FIG. 12A, the dummy bump 114 is located directly on the dielectric layer 1211 of the redistribution layer 1210. The redistribution layer 1210 and the dielectric layer 1211 are similar to or substantially the same as the redistribution 110 and its topmost dielectric layer 106e described in FIG. 1. In some embodiments, referring to FIG. 12B, the dummy bump 114 is located directly on the topmost dielectric layer 1211 of the redistribution layer 1210, and covers the crater CT of the dielectric layer 1211. In some embodiments, referring to FIG. 12C, the dummy bump 114 covers the crater CT of the dielectric layer 1211 of the redistribution layer 1210 and the metallic pad P2 exposed by the crater CT, so that the dummy bump 114 is located directly on the electrically floating metallic pad P2. In the embodiments, the dummy bumps 114 as shown in FIGS. 12A-12C are electrically floating.

Referring to FIG. 2 and FIG. 3, in some embodiments, another carrier 103 is provided and attached to the structure of the redistribution layer 110 with the bonding portions 112, and the carrier 102 is detached through the debonding layer 104 and both are removed. Then, the whole structure JS is flipped so that the bottommost dielectric layer 106a of the redistribution layer 110 is exposed and facing upward and portions of the bottommost conductive layer 108a are exposed from the surface of the dielectric layer 106a. In some embodiments, the bonding portions 112 are attached to the carrier 103. In some embodiments, the carrier 103 is a carrying tape film.

In some embodiments, referring to FIG. 3, joining portions 118 are formed on the exposed portions (e.g. vias) of the conductive layer 108a of the redistribution layer 110. In some embodiments, the joining portions 118 are electrically connected with the redistribution layer 110 (e.g. the conductive layers 108a, 108b, 108c, 108d, 108e). In embodiments, the formation of joining portions 118 includes forming a mask pattern (not shown) on the redistribution layer 110 with openings, forming a metallic material filling up the openings to form metallic portions and then removing the mask pattern.

In some embodiments, the materials of the joining portions 118 may be selected from copper, cobalt, nickel, aluminum, tungsten, alloys or combinations thereof. In some embodiments, the joining portions 118 further optionally include an adhesion layer, a seed layer, pre-solder, solder paste and/or under-ball metallurgy (UBM) patterns formed on the surfaces of the joining portions for enhancing bonding. For example, the joining portions 118 may be formed by electroplating or deposition. In some embodiments, the conductive joining portions 118 are, for example, microbumps, metal posts, metal posts with solder paste, electroless nickel electroless palladium immersion gold (ENEPIG) formed bumps, or controlled collapse chip connection (C4) bumps.

As seen in FIG. 4, in some embodiments, at least one circuit substrate 200 is mounted and bonded to the structure JS. In some embodiments, the circuit substrate 200 includes a build-up board, a printed circuit board, a laminated board or a flexible laminate board. In some embodiments, the circuit substrate 200 may include one or more active components, passive components, or a combination thereof. In some embodiments, the circuit substrate 200 includes a dielectric material core structure 201 sandwiched between dielectric material layers 203, and insulting layers 205 laminated on the dielectric material layers 203, as well as metallization patterns including pads 206 embedded in the dielectric material layers 203. In some embodiments, the metallization patterns are designed to electrically connect the various components such as the active components and/or passive components embedded in the circuit substrate to form functional circuitry. In some embodiments, the circuit substrate 200 is provided with joining connectors 210 attached to the pads 206 of the circuit substrate 200. The circuit substrate 200 may provide single-side or dual-side electrical connection.

Referring to FIG. 4, the circuit substrate 200 is mounted to the structure JS, and the joining portions 118 of the structure JS are respectively bonded with the joining connectors 210 located on the pads 206 of the circuit substrate 200. In some embodiments, through performing a reflow process, the joining portions 118 of the structure JS are joined and fused with the joining connectors 210 on the pads 206 of the substrate 200. In some embodiments, the reflow process includes performing a thermal compression bonding process to turn the joining portions 118 into a melted state or a semi-melted state to integrate and bond with the connectors 210 located between the structure JS and the circuit substrate 200. The reflow temperature may be higher than a melting point of joining portions 118 and/or the solder paste.

In FIG. 4, in some embodiments, an underfill 240 is formed and filled between the structure JS and the circuit substrate 200. In some embodiments, the underfill 240 is filled between the structure JS and the circuit substrate 200 and filled between the fused connectors 210 that are located between the structure JS and the circuit substrate 200. In some embodiments, the underfill 240 filled between the structure JS and the circuit substrate 200 can protect the fused connectors 210 against thermal or physical stresses and further secure the bonding of the structure JS with the circuit substrate 200.

In some embodiments, the underfill 240 is formed by capillary underfill filling (CUF) and the underfill 240 not only fills between the redistribution layer 110 and the circuit substrate 200 but also fills up the gaps between the connectors 210. In some embodiments, a curing process may be performed to solidify the underfill 240.

Figure 5:
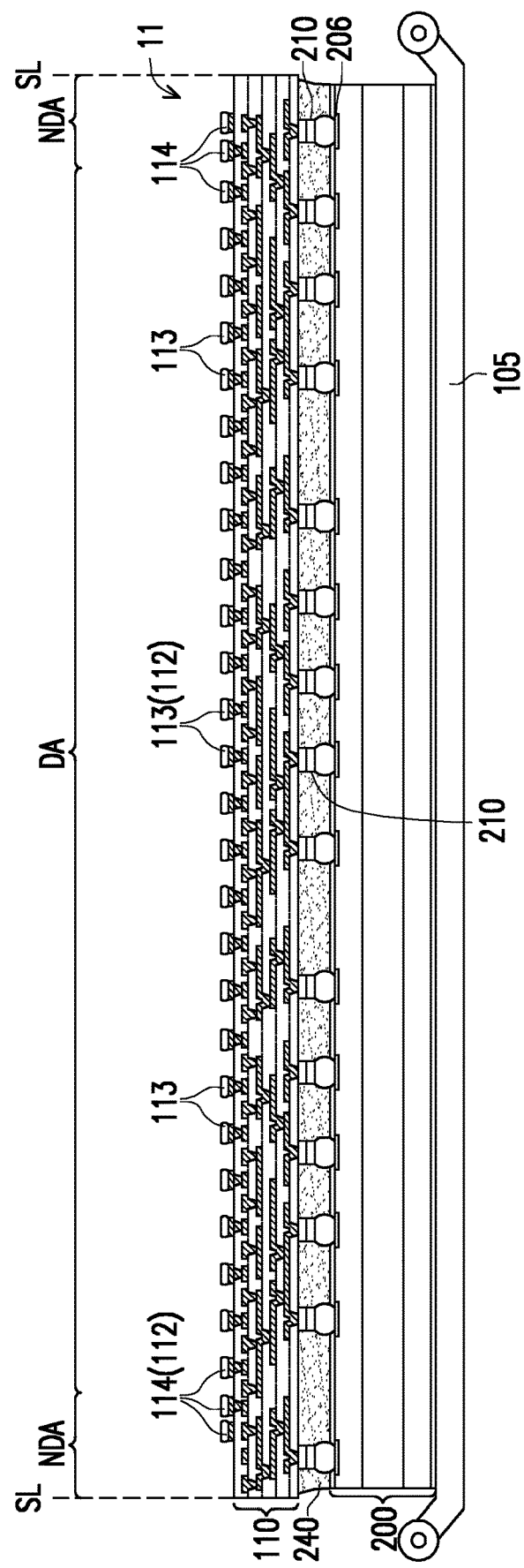

In some embodiments, referring to FIG. 5, after the underfill 240 is formed, a dicing process is performed to the structure JS along the scribing lanes SL (cutting lanes). In some embodiments, the dicing process is performed to cut the whole structure JS (at least cutting though the redistribution layer 110) and the bonded circuit substrate 200 into individual and separated units 11. In some embodiments, the dicing process is performed to cut through the structure JS along the scribing lanes SL without cutting into the corresponding circuit substrate 200 and the underfill 240. Later, the individual unit 11 is flipped and transferred to another carrier 105. In some embodiments, the carrier 105 is a carrying tape film. In one embodiment, the dicing process is a wafer dicing process including mechanical sawing, blade dicing and/or laser cutting. In some embodiments, as the dummy bumps 114 are located beside the scribing lanes SL, the cutting blade or dicing saw cutting through the redistribution layer 110 does not cut into or pass through the dummy bumps 114. That is, the dummy bumps are not diced or damaged during the dicing process.

Figure 6:
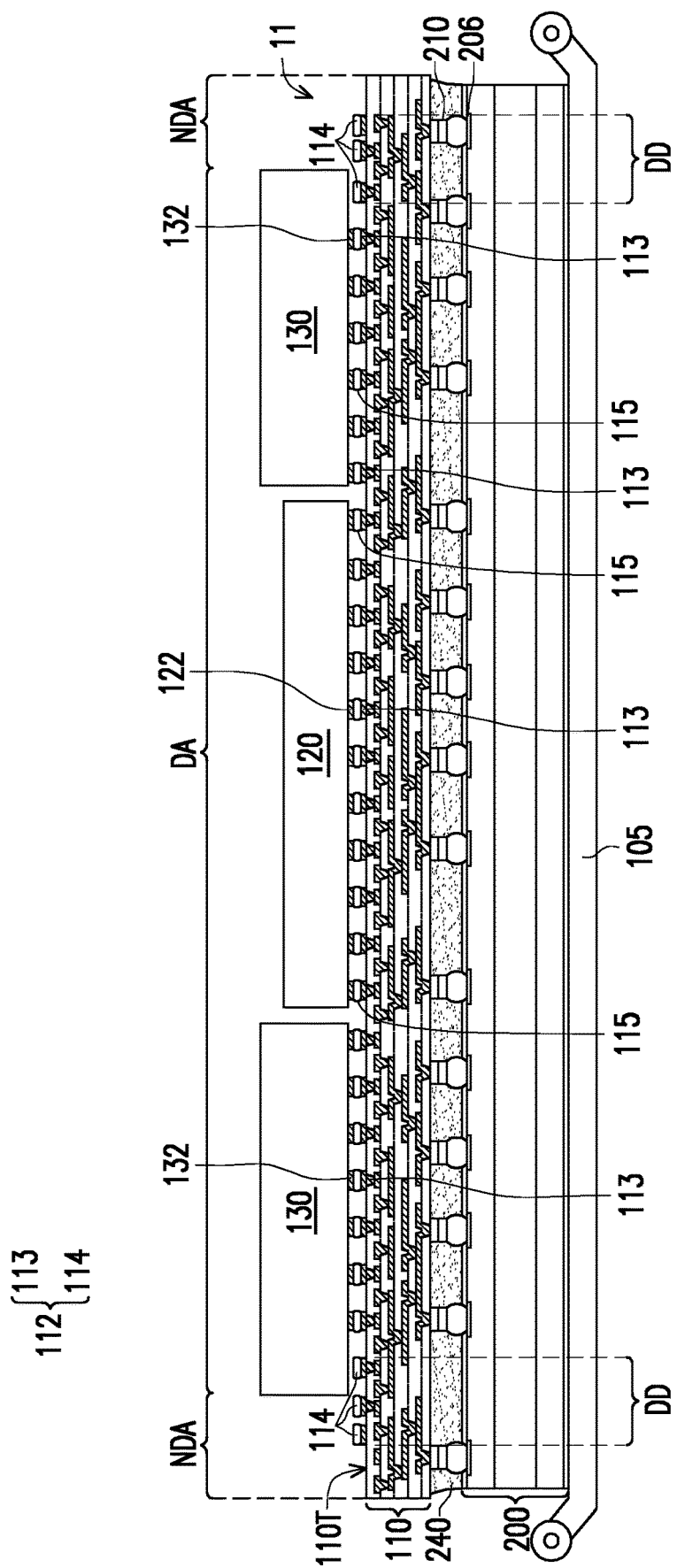

Referring back to FIG. 6, at least one first semiconductor die 120 and two or more second semiconductor dies 130 are provided and placed on the redistribution layer 110 over the carrier 105. In some embodiments, the first semiconductor die 120 and the second semiconductor die(s) 130 are disposed in the die attaching region DA and attached onto the top surface 110T of the redistribution layer 110. In FIG. 6, three dies are shown as the exemplary dies of the package structure, but it is understood that multiple dies or two or more types of dies or different types of dies may be included within the package structure. In some embodiments, the first semiconductor die 120 and the second semiconductor die(s) 130 are different types of dies or perform different functions. In some embodiments, the first semiconductor die 120 may include one or more of an application-specific integrated circuit (ASIC) chip, an analog chip, a sensor chip, a wireless application chip (such as a Bluetooth chip or a radio frequency chip), a voltage regulator chip or a system-on-a chip (SoC). In some embodiments, the second semiconductor dies 130 include one or more memory chips, such as high bandwidth memory (HBM) chips, dynamic random access memory (DRAM) chips or static random access memory (SRAM) chips. In some embodiments, one of the second dies 130 may be a memory die including memory chips, and the other die 120 may be a SoC die including a controller chip. In certain embodiments, dies and chips may be used interchangeably.

In certain embodiments, in FIG. 6, the first and second semiconductor dies 120, 130 are respectively provided with contacts 122, 132 facing downward, after aligning the contacts 122, 132 with the corresponding conducting bumps 113, the contacts 122, 132 of the semiconductor dies 120, 130 are respectively bonded to the conducting bumps 113 of the bonding portions 112 on the redistribution layer 110. In one embodiment, the bonding of the semiconductor dies 120, 130 to the redistribution layer 110 includes performing a reflow process or a thermal compression bonding process to bond the contacts 122, 132 with the conducting bumps 113 to become fused connectors 115. In some embodiments, through the conducting bumps 113 and the contacts 122, 132 (i.e. through the fused connectors), the first and second semiconductor dies 120, 130 are electrically connected with the redistribution layer 110, while the dummy bumps are electrically unconnected with the first and second semiconductor dies 120, 130. In some embodiments, the dummy bumps 114 are electrically floating. The dummy bumps 114 are not electrically connected or coupled with any of the semiconductor dies. In some embodiments, the contacts 122, 132 are micro-bumps, metallic posts such as copper posts, copper alloy posts or other suitable metallic connectors. In certain embodiments, the semiconductor dies 120, 130 are mounted onto the redistribution layer 110 over the carrier 102 side-by-side, and the number of the dies arranged side-by-side or stacked over another die(s) may be adjusted or modified based on the product design but are not limited by the exemplary embodiments. In some embodiments, as illustrated in FIG. 5 and FIG. 6, based on the product design and the locations of the scribe lanes SL, at least one first semiconductor die 120 and multiple second semiconductor die 130 are included in each package unit 11 after dicing.

As seen in FIG. 6, after mounting and bonding the first and second semiconductor dies 120, 130 to the redistribution layer 110, some of the dummy bumps 114 are located right below the second semiconductor dies 130 (within the die attaching region DA), and are not connected with the contacts of the above semiconductor dies. In some embodiments, the dummy bumps 114 that are located right below the second semiconductor dies 130 are physically separate and spaced apart from the above second semiconductor dies 130. Although the dummy bumps 114 are shown in FIG. 6 as located below the second semiconductor dies 130, it is possible that the dummy bumps are located below other different semiconductor dies or both, depending on the layout arrangement of the dies.

According to the above exemplary embodiments, the layout and configuration of the redistribution layer 110 may be suitably formed within the wafer-level package structures. Although one frontside redistribution layer is described in the above embodiments, more than one or multiple redistribution layers (RDLs) may be provided in the package structure or arranged on both front side and back side of the die(s) or chip(s) for signal redistributions among multiple dies or chips. Additionally, the semiconductor package 11 may further include additional dies or sub-package units disposed over or below the dies and another redistribution layer(s) may be formed to electrically connect the additional dies or sub-package units. The structures and/or the processes of the present disclosure are not limited by the exemplary embodiments. In some embodiments, the sizes or dimensions of the connectors 210 are larger than the sizes or dimensions of the fused connectors 115 in the package structure 11.

Figure 7:
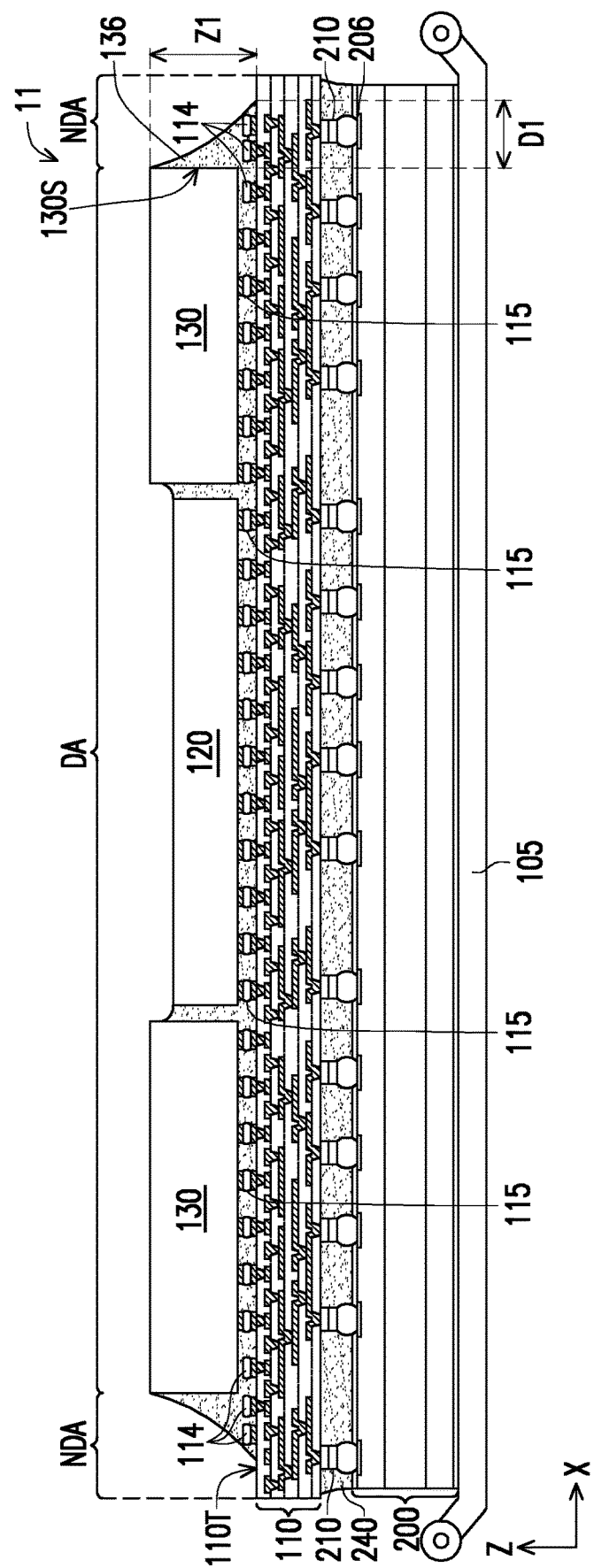

Referring to FIG. 7, an underfill 136 is filled between the first and second semiconductor dies 120, 130 and the redistribution layer 110, encapsulating the fused connectors 115 and covering the dummy bumps 114.

FIG. 9 illustrates an exemplary schematic top view of a package unit of the package structure. In some embodiments, as seen in the schematic top view, four second semiconductor dies 130 are arranged at two opposite sides of the first semiconductor die 120. In some embodiments, the first semiconductor die 120 has a larger die size and/or has multiple functionality, while the second semiconductor dies 130 have a smaller die size. From the planar top view of FIG. 9, considering the semiconductor dies 120, 130 being transparent, the locations of the semiconductor dies 120, 130 are denoted by the dashed lines, the distribution regions (active regions) AA of the conducting bumps 113 in the semiconductor dies 120, 130 are shown as shaded regions, and the borders of the die attaching region DA (defined by the outer sidewalls of the dies 120, 130 and labeled as the bold dotted line in FIG. 9) are vertically aligned with the outer sidewalls of the dies. As seen in FIG. 6 and from the planar top view of FIG. 9, the distribution span DD of the dummy bumps 114 is partially overlapped with the die attaching region DA, and the dummy bumps 114 are arrange around the periphery or the rim of the die attaching region DA. For example, considering the distribution region AA of the conducting bumps 113 of the semiconductor die 120 has a square shape with a distribution distance DS1, the distribution distance DS2 of the distribution span DD of the dummy bumps 113 ranges from about 0.01% to about 30% of the distance DS1.

In some embodiments, using round shaped bumps as examples, the size (diameter) of the conducting bumps 113 is substantially the same as the size (diameter) of the dummy bumps 114. From the planar top view of FIG. 9, the dummy bumps 114 are arranged along outward sides (non-facing sides) of the first and second semiconductor dies 120, 130 (i.e. along the rim of the die attaching region DA) and surrounding the die attaching region DA.

In some embodiments, as seen in FIG. 10, some dummy bumps 114' are arranged around the facing sides between the two adjacent second semiconductor dies 130, and the dummy bumps 114' are of a smaller size than that of the dummy bumps 114. However, no dummy bumps are located between the two facing sides of the adjacent first and second semiconductor dies 120, 130. From the planar top view of FIG. 10, except for the dummy bumps 114 arranged as two rows around the rim of the die attaching region DA, smaller dummy bumps 114' are arranged around the right side of the die attaching region DA (i.e. around the outward sides of the two second semiconductor dies 130 located at the right side). In some embodiments, using round shaped bumps as examples, the size (diameter) of the conducting bumps 113 is larger than the size (diameter) of the dummy bumps 114.

It is understood that the number of the rows of the dummy bumps are not limited to the exemplary drawings herein. Depending on the product requirements, the rows of the dummy bumps may range from two rows to thirty rows or even to sixty rows. In some embodiments, by arranging ten rows to thirty rows of dummy bumps surrounding the outer sides of the adjacent semiconductor dies, the coplanarity of the overall formed bumps (i.e. the total thickness variation) is improved by about 12% to about 36%. In some embodiments, the arrangement of the dummy bumps may be symmetric or asymmetric, relative to the layout of the dies. Also, two or more types of dummy bumps may be formed, with different structures, dimensions and/or materials, depending on the layout design.

Referring back to FIG. 7, the underfill 136 filled between the first and second semiconductor dies 120, 130 and the redistribution layer 110 encapsulates the fused connectors 115 for better attachment. In some embodiments, the underfill 136 also encapsulates the dummy bumps 114. Also, by filling the gaps between the first and second semiconductor dies 120, 130, the redistribution layer 110, and the fused connectors 115, the underfill 136 relieves the thermal stress concentrated on the joints of the connectors and the joint reliability is enhanced. Due to the existence of the dummy bumps 114 and 114', the underfill 136 has a steep profile as the extension range of the underfill 136 is guided by the arrangement and distribution of the dummy bumps. Compared with the structure without the dummy bumps and with overflowing underfill, the underfill 136 formed in the structure with the dummy bumps 114 and 114' has an average extension distance about 10%-40% shorter, or at least 25% shorter. That means that, for the structure with dummy bumps, the underfill 136 spreads out to cover mainly the dummy bumps 114 with a shorter extension distance. In general, the dummy bumps guide and constrain the extension range of the underfill. In some embodiments, the underfill 136 has an average extension distance, which is obtained from averaging the extension distances D1 in the X-direction or Y-direction (the shortest distance measuring from the sidewall of the die(s) to the edge of the underfill 136), ranging from 50 microns to 5000 microns. In some embodiments, the underfill 136 has a height Z1 (measuring from the top surface 110T of the redistribution layer 110 to the topmost point of the underfill 136 in the thickness direction Z) substantially about the same as the height of the second semiconductor die(s) 130. Through the arrangement of the dummy bumps, the underfill is formed with a steep profile, and the underfill not only strengthens the bonding and attachment of the dies with the redistribution layer but also provides higher layout flexibility for being space economical. In some embodiments, as the underfill 136 is constrained by the locations of the dummy bumps 114, the formed underfill 136 does not overflow outside the package unit and does not cover the sidewalls of the cut redistribution layer 110 of the package structure 11.

In some embodiments, as seen in FIG. 7, the underfill 136 substantially fills the gaps between the fused connectors 115, and fills between the first and second semiconductor dies 120 and 130. In some embodiments, the underfill 136 is formed as a void-free filling material filling up the spaces between dies and the redistribution layer 110 and between the fused connectors 115. In some embodiments, the material of the underfill 136 includes epoxy resins or other suitable polymer material and optionally fillers such as silica or alumina. In some embodiments, the underfill 136 is formed by performing a capillary filling process and then a low temperature curing process. In some embodiments, the underfill 136 not only fills up the gaps between dies and the redistribution layer 110 and between the fused connectors 115 but also spreads over to cover the sidewalls 130S of the second semiconductor dies 130. In some embodiments, the sidewalls 130S of the second semiconductor dies 130 are fully covers by the underfill 136. In some embodiments, the underfill 136 encapsulates the dummy bumps 114 and extends from sidewalls 130S of the respective second semiconductor dies 130 outwardly until it reaches the outmost dummy bumps 114 (e.g. the outmost edges of the dummy bumps 114) of the outmost row. That means that the underfill 136 extends horizontally from outward sidewalls of the dies 130 to reach and fully cover the dummy bumps 114. As the dummy bumps 114 are spaced apart and unconnected with the respective second semiconductor dies 130, the underfill 136 is the only thing sandwiched between the dummy bumps 114 and the respective second semiconductor dies 130. In some embodiments, the underfill 136 is in direct physical contact with the dummy bumps 114 and wraps around the dummy bumps 114 that are located under the second semiconductor dies 130 and outside the second semiconductor dies 130 on the redistribution layer 110. From the schematic top view of FIG. 9, some of the dummy bumps 114 that are located below the second semiconductor dies 130 fall within the vertical projections (the dashed lines) of the second semiconductor dies 130, while some of the dummy bumps 114 that are located beside the second semiconductor dies 130 are located outside the vertical projections (the dashed lines) of the second semiconductor dies 130.

Through these conductive connections and the redistribution structure, the semiconductor dies 120, 130 of finer pitches are electrically connected with the circuit substrate 200 of further larger pitches.

Figure 8:
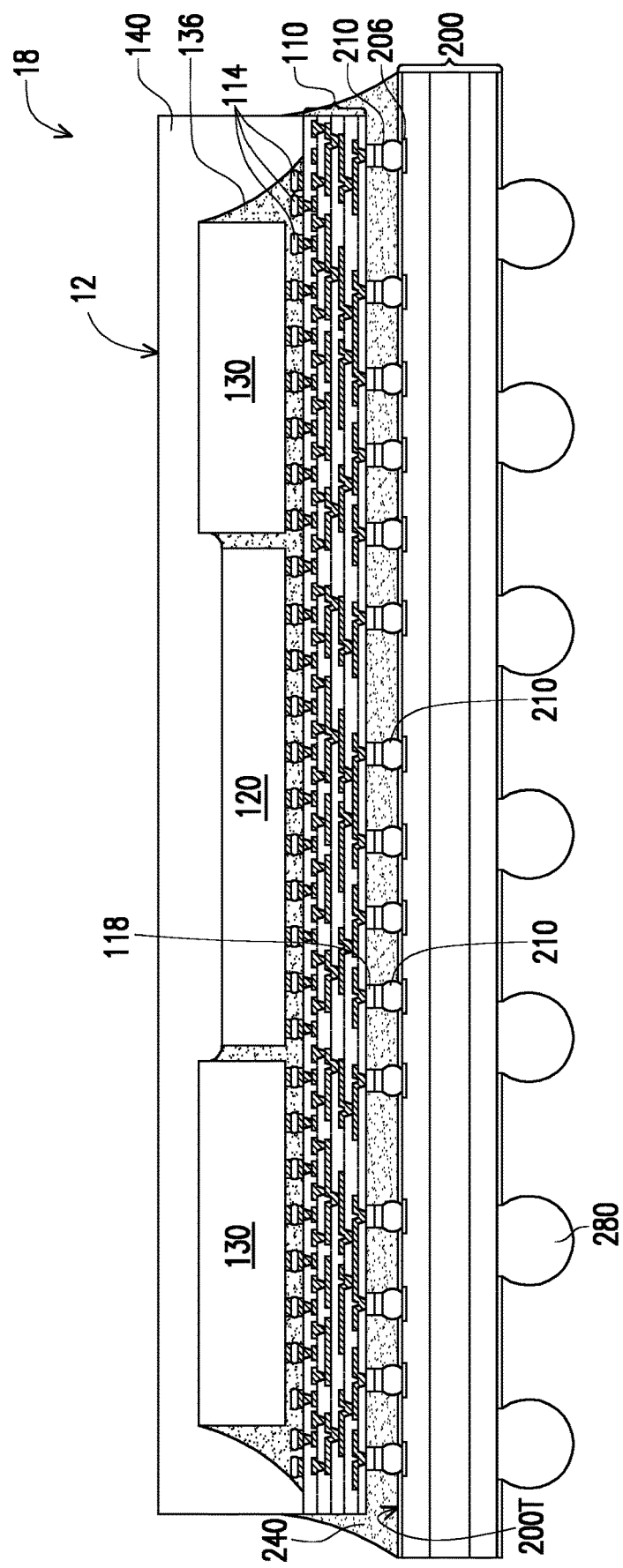
FIG. 8 is a schematic cross-sectional view of a package structure with dummy bumps according to an exemplary embodiment of the present disclosure.

FIG. 8 is a schematic cross-sectional view of a package structure with dummy bumps according to an exemplary embodiment of the present disclosure.

As seen in FIG. 8, in some embodiments, a package structure 18 including a package unit 12 mounted and bonded to a circuit substrate 200 is illustrated. In some embodiments, the package unit 12 includes dies 120, 130 bonded to the redistribution layer 110, dummy bumps 114 located on the redistribution layer 110 and an underfill 136 filled between the dies 120, 130 and the redistribution layer 110. In some embodiments, the dies 120, 130, the redistribution layer 110, the dummy bumps 114, the underfill 136 and the circuit substrate 200 are substantially the same or similar to the corresponding elements as described in the above paragraphs, and similar or the same elements may be denoted using the same reference labels in various embodiments. As seen in FIG. 8, the circuit substrate 200 may provide single-side or dual-side electrical connection and prove further electrical connection through the conductive balls 280.

Referring to FIG. 8, the package structure 12 further includes a molding compound 140 on the redistribution layer 110 encapsulating the semiconductor dies 120, 130 and the underfill 136. In some embodiments, the molding compound 140 at least laterally wraps around the underfill 136 as well as the semiconductor dies 120, 130 on the redistribution layer 110. In one embodiment, the material of the molding compound 140 includes epoxy resins, phenolic resins or silicon-containing resins. In some embodiments, the material of the molding compound 140 includes filler particles such as silica particles. In some embodiments, the molding compound 140 may be over-molded to be higher than the dies 120, 130. In some embodiments, the molding compound 140 is over-molded and then planarized to further reduce the thickness of the molding compound 140.

In FIG. 8, in some embodiments, an underfill 240 is formed and filled between the package structure 12 and the circuit substrate 200. In some embodiments, the underfill 240 not only fills up the gaps between the package structure 12 and the circuit substrate 200 but also overflows to partially cover the sidewalls of the package 12 (covers the sidewalls of the diced redistribution layer 110).

According to the above exemplary embodiment, the package structure(s) may be suitably formed following the processes for fabricating the integrated fan-out (InFO) wafer-level package structure. More than one or multiple redistribution layers (RDLs) may be provided in the package structure or arranged on both front side and back side of the die(s) or chip(s) for signal redistributions among multiple dies or chips. The structures and/or the processes of the present disclosure are not limited by the exemplary embodiments.

Figure 13:
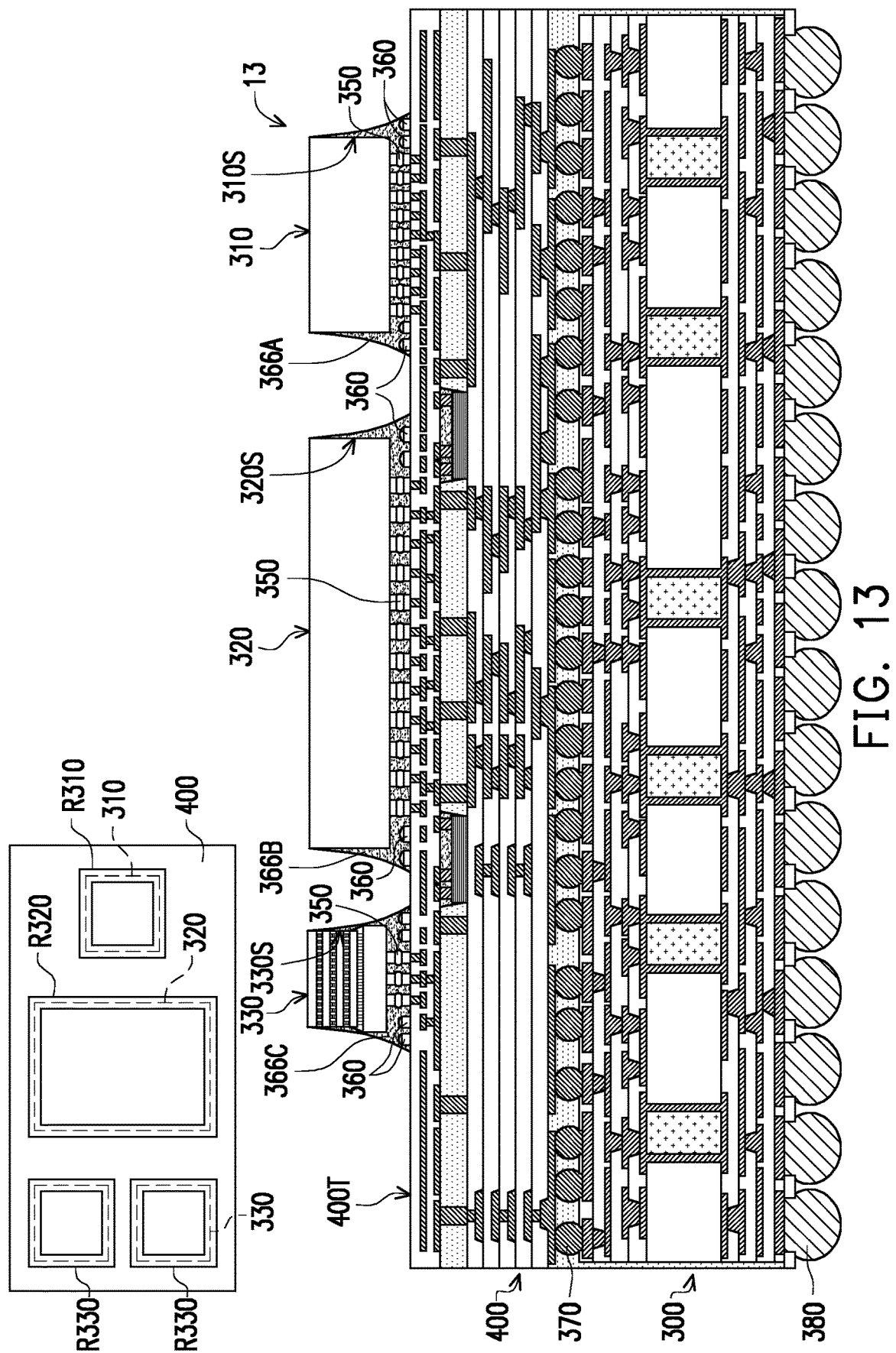
FIG. 13 and FIG. 14 are schematic cross-sectional views of package structures with dummy bumps according to some exemplary embodiments of the present disclosure.
Figure 14:
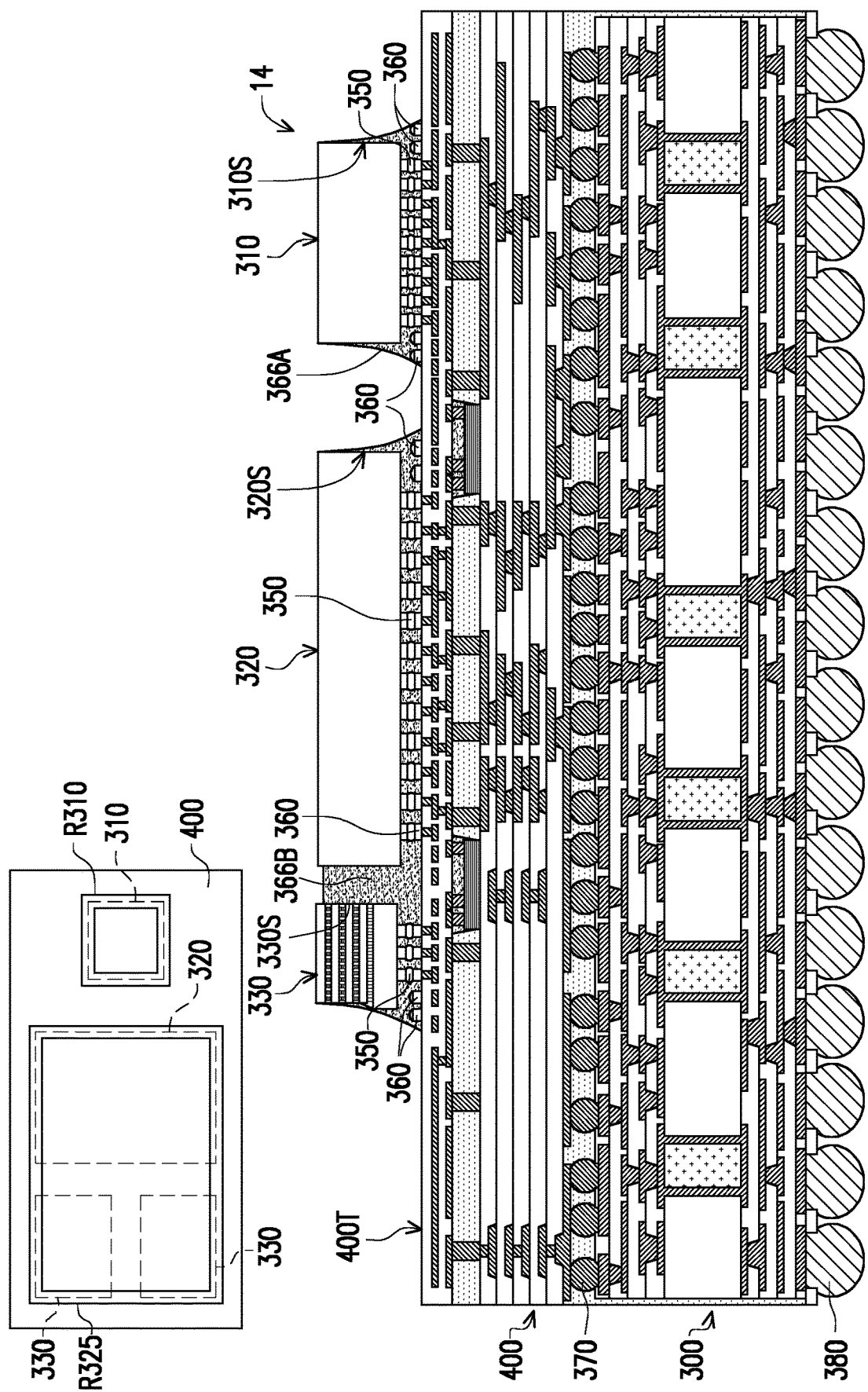

FIG. 13 and FIG. 14 are schematic cross-sectional views of package structures with dummy bumps according to some exemplary embodiments of the present disclosure.

In some embodiments, referring to FIG. 13, the semiconductor package 13 includes an organic substrate 300, conductive connectors 380 disposed on the bottom side of the organic substrate 300, and a multilayered structure 400 disposed on the top side of the organic substrate 300 and connected with the organic substrate 300 through conductive connectors 370. In some embodiments, the semiconductor package 13 includes a first integrated circuit (IC) module 310, a second IC module 320 and a third IC module 330 disposed on the multilayered structure 400. In some embodiments, the first, second and third IC modules 310, 320, 330 are different types of modules and have different functionalities. For example, either of the first, second and third IC modules 310, 320, 330 may include one or two or more types of semiconductor dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, a hybrid memory cube (HMC), a high bandwidth memory (HBM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the first IC module 310 includes a logic die, the second IC module 320 includes a power management die and the third IC module 330 includes a memory die. In one embodiment, the IC modules may include the package(s) similar or the same configurations as described above, and the multilayered structure 400 may include the redistribution layer(s) as described above, and the similar structures may be fabricated following the manufacturing method as depicted from FIG. 1 to FIG. 8. In some embodiments, the multilayered structure 400 provides electrical pathing and connection between the IC modules and the organic substrate 300 by way of conductive bumps 370. In some embodiments, the organic substrate 300 provides structural support for the package, as well as providing electrical signal routing between the IC modules and the laminate circuits such as printed circuit board (PCB) or other sub-packages, but not limited thereto.

In some embodiments, the first, second and third IC modules 310, 320, 330 are bonded to the multilayered structure 400 through connectors 350, and the connectors 350 electrically connect the first, second and third IC modules 310, 320, 330 with the multilayered structure 400 and the organic substrate 300. As seen in FIG. 13, the semiconductor package 13 also includes dummy bumps 360 located between the first, second and third IC modules 310, 320, 330 and the top surface 400T of the multilayered structure 400 and located on the top surface 400T of the multilayered structure 400, and the dummy bumps 360 are electrically floating. Referring to FIG. 13, for the first, second and third IC modules 310, 320, 330, the dummy bumps 360 are located under (not in contact with) the above modules, and are arranged as outer rows surrounding the connectors 350. Referring to FIG. 13, for the first, second and third IC modules 310, 320, 330, underfills 366A, 366B, 366C are respectively formed between the first, second and third IC modules 310, 320, 330 and the multilayered structure 400, and the underfills 366A, 366B, 366C are respectively filled between the corresponding first, second and third IC modules 310, 320, 330 and the top surface 400T of the multilayered structure 400 and cover the top surface 400T of the multilayered structure 400. In some embodiments, the underfills 366A, 366B, 366C fill the gaps between the connectors 350 located between the first, second and third IC modules 310, 320, 330 and the top surface 400T of the multilayered structure 400.

In some embodiments, as seen in FIG. 13, the underfill 366A encloses the dummy bumps 360 and fully covers the sidewalls 310S of the first IC module 310 (extending from the top side of the sidewalls 310S to the top surface 400T of the multilayered structure 400). In some embodiments, as seen in FIG. 13, the underfill 366B encloses the dummy bumps 360 and fully covers the sidewalls 320S of the second IC module 320. In some embodiments, as seen in FIG. 13, the underfill 366C encloses the dummy bumps 360 and partially covers the sidewalls 330S of the third IC module 330 (extending from the upper parts of the sidewalls 330S to the top surface 400T of the multilayered structure 400). As seen in at the upper left part of FIG. 13, the relative layout of the modules and the distribution regions of the dummy bumps are shown, the first, second and third IC modules 310, 320, 330 (vertical projections shown in dotted lines) are arranged side by side and spaced apart from one another, the distribution regions R310, R320, R330 of the dummy bumps 360 that are disposed under the corresponding first, second and third IC modules 310, 320, 330 are shown as three separate rings surrounding the corresponding first, second and third IC modules 310, 320, 330 and partially overlap with the vertical projections of the corresponding first, second and third IC modules 310, 320, 330.

Referring to FIG. 14, in some embodiments, the dummy bumps 360, for the first, second and third IC modules 310, 320, 330, are located under (not in contact with) the above modules, and are arranged as rows surrounding the outer sidewalls of the modules. Referring to FIG. 14, for the first IC module 310, an underfill 366A is filled between the first IC module 310 and the multilayered structure 400, and the underfill 366A encloses the dummy bumps 360 and fully covers the sidewalls 310S of the first IC module 310 (extending from the top side of the sidewalls 310S to the top surface 400T of the multilayered structure 400). In FIG. 14, in some embodiments, the second and third IC modules 320, 330 are disposed as one group, the dummy bumps 360 are arranged around the outward sidewalls of the second and third IC modules 320, 330 and no dummy bumps are arranged along the facing sidewalls of the second and third IC modules 320, 330. In some embodiments, as seen in FIG. 14, the underfill 366B encloses the dummy bumps 360 and fully covers the outward sidewalls 320S, 330S of the IC modules 320, 330. As seen in at the upper left part of FIG. 14, the relative layout of the modules and the distribution regions of the dummy bumps are shown, the first, second and third IC modules 310, 320, 330 (vertical projections shown in dotted lines) are arranged side by side and spaced apart from one another, the distribution region R310 of the dummy bumps 360 under and around the first IC module 310 is shown as a ring and partially overlap with the vertical projections of the first IC module 310, while the distribution region R325 of the dummy bumps 360 that are disposed under and around the second and third IC modules 320, 330 is shown as another individual ring surrounding the corresponding second and third IC modules 320, 330 and partially overlap with the vertical projections of the second and third IC modules 320, 330.

Due to the existence of the dummy bumps, the underfill(s) has a steep profile with a short extension distance and almost covers the whole sidewalls of the module(s). Through the arrangement of the dummy bumps, the steep profiled underfill strengthens the bonding and attachment of the connectors and less overflow of the underfill leads to layout flexibility and larger process windows. Through the formation of the dummy bumps, the formed bumps and connectors have better uniformity and less thickness variation, leading to satisfactory bonding reliability for the package structure.

The disclosure is not limited neither by the type nor the number of semiconductor packages connected to the circuit substrate. It will be apparent that different types of semiconductor package units may be used to produce semiconductor device package structures including the circuit substrate disclosed herein, and all these semiconductor devices are intended to fall within the scope of the present description and of the attached claims. For example, Chip-On-Wafer-On-Substrate (CoWoS) structures, three-dimensional integrated circuit (3DIC) structures, Chip-on-Wafer (CoW) packages, Package-on-Package (PoP) structures may all be used as the semiconductor package units, alone or in combination.

According to some embodiments, a semiconductor package has a redistribution layer, a semiconductor die, conducting connectors, dummy bumps and an underfill. The semiconductor die is disposed on a top surface of the redistribution layer and electrically connected with the redistribution layer. The conducting connectors are disposed between the semiconductor die and the redistribution layer, and are physically and electrically connected with the semiconductor die and the redistribution layer. The dummy bumps are disposed on the top surface of the redistribution layer, beside the conducting connectors and under the semiconductor die. The underfill is disposed between the semiconductor die and the redistribution layer and sandwiched between the dummy bumps and the semiconductor die. The dummy bumps are electrically floating. The dummy bumps are in contact with the underfill without contacting the semiconductor die.

According to some embodiments, a package structure includes at least a first die, a second die, a redistribution layer, dummy bumps, an underfill and a circuit substrate. The first die and the second die are arranged side by side. The circuit substrate is disposed under the first and second dies and electrically connected with the first die and second die. The redistribution layer is disposed between the first and second dies and the circuit substrate. The redistribution layer has a die attaching region, the first die and second die are disposed on a first side of the redistribution layer and within the die attaching region. The redistribution layer is electrically connected with the first die and the second die through connectors therebetween. The dummy bumps are disposed on the first side of the redistribution layer and spaced apart from the first die and the second die. The dummy bumps are electrically unconnected with the first die and the second die. The underfill is disposed between the first die, the second die and the redistribution layer and filled between the dummy bumps and the first die and the second die. The dummy bumps are distributed over a distribution span and the distribution span is partially overlapped with the die attaching region.

According to some embodiments, a manufacturing method for a package structure is provided. A redistribution layer having dielectric layer and conductive layers stacked in alternation is formed. Conducting bumps and dummy bumps are formed on a top surface of the redistribution layer. A semiconductor die with joining portions is provided. The semiconductor die is disposed onto the redistribution layer, and the joining portions are aligned with the conducting bumps on the top surface of the redistribution layer. The semiconductor die is bonded to the redistribution layer by joining the conducting bumps with the joining portions, so that the semiconductor die is electrically connected to the redistribution layer. An underfill is dispensed between the semiconductor die and the redistribution layer and between the semiconductor die and the dummy bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a redistribution layer;
   a semiconductor die, disposed on a top surface of the redistribution layer and electrically connected with the redistribution layer;
   conducting connectors, disposed between the semiconductor die and the redistribution layer, and physically and electrically connected with the semiconductor die and the redistribution layer;
   dummy bumps, disposed on the top surface of the redistribution layer, beside the conducting connectors and under the semiconductor die; and
   an underfill, disposed between the semiconductor die and the redistribution layer, wrapping around the conducting connectors and extending between the dummy bumps and sidewalls of the semiconductor die,
   wherein the underfill fully covers outermost sidewalls of the semiconductor die without covering a top surface of the semiconductor die, the dummy bumps are electrically floating and the dummy bumps are in contact with the underfill without contacting the semiconductor die, and
   wherein second dummy bumps of the dummy bumps are located outside a vertical projection of the semiconductor die, and the underfill extends outwardly from the outermost sidewalls of the semiconductor die to outermost second dummy bumps of the second dummy bumps.

2. The semiconductor package as claimed in claim 1, wherein the dummy bumps are distributed over a distribution span, and the distribution span is partially overlapped with the vertical projection of the semiconductor die on the top surface of the redistribution layer.

3. The semiconductor package as claimed in claim 2, wherein the dummy bumps are arranged surrounding the conducting connectors and the distribution span of the dummy bumps is in a ring shaped from a top view.

4. The semiconductor package as claimed in claim 2, wherein first dummy bumps of the dummy bumps are located directly under the semiconductor die and fall within the vertical projection of the semiconductor die, the second dummy bumps of the dummy bumps are located along a border of the vertical projection and the first dummy bumps and the second dummy bumps are located at a same side of the redistribution layer.

5. The semiconductor package as claimed in claim 1, wherein the dummy bumps are located directly on a dielectric layer of the redistribution layer.

6. The semiconductor package as claimed in claim 1, wherein the underfill surrounds the conducting connectors.

7. The semiconductor package as claimed in claim 1, wherein the dummy bumps include micro bumps.

8. The semiconductor package as claimed in claim 1, wherein the dummy bumps include metallic posts.

9. A package structure comprising:
   a first die and a second die, arranged side by side, wherein the first die has a first height and the second die has a second height smaller than the first height;
   a circuit substrate, disposed under the first and second dies and electrically connected with the first die and second die;
   a redistribution layer, disposed between the first and second dies and the circuit substrate, wherein the redistribution layer has a die attaching region, the first die and second die are disposed on a first side of the redistribution layer and within the die attaching region, and the redistribution layer is electrically connected with the first die and the second die through connectors therebetween;
   dummy bumps, disposed on the first side of the redistribution layer and spaced apart from the first die and the second die, where dummy bumps are electrically unconnected with the first die and the second die; and
   an underfill, disposed between the first die, the second die and the redistribution layer and filled between a front side surface of the redistribution layer, the dummy bumps and the first die and the second die; and
   wherein the dummy bumps are distributed over a distribution span and the distribution span is partially overlapped with the die attaching region, and the underfill extending from outer sidewalls of the first die to the front side surface of the redistribution layer has a third height larger than the second height and about the same with the first height, and
   wherein the underfill extends outwardly from the outer sidewalls of the first die and outer sidewalls of the second die to reach and cover the dummy bumps that are located outside the die attaching region.

10. The structure as claimed in claim 9, wherein the dummy bumps that are located directly under the first die or the second die are located in the die attaching region, and the dummy bumps that are located outside the die attaching region are arranged along a periphery of the die attaching region.

11. The structure as claimed in claim 9, wherein the dummy bumps are arranged surrounding the connectors and the distribution span of the dummy bumps is in a ring shaped from a top view.

12. The structure as claimed in claim 9, wherein the underfill fills between the connectors.

13. The structure as claimed in claim 9, wherein the redistribution layer includes multiple dielectric layers and multiple conductive layers arranged in alternation, and the dummy bumps are disposed directly on a topmost dielectric layer of the multiple dielectric layers of the redistribution layer.

14. The structure as claimed in claim 13, wherein the connectors are disposed on a topmost conductive layer of the multiple conductive layers of the redistribution layer.

15. The structure as claimed in claim 9, wherein dummy bumps are electrically floating and electrically unconnected with the redistribution layer, the first die and the second die.

16. The structure as claimed in claim 9, further comprising conductive connectors located between the circuit substrate and the redistribution layer.

17. The structure as claimed in claim 12, wherein the underfill covers the whole outer sidewalls of the first die and the second die without covering sidewalls of the redistribution layer and top surfaces of the first and second dies.

18. A package structure comprising:
   first dies and a second die, arranged side by side and spaced apart from one another, wherein the second die located between the first dies has a second height smaller than a first height of the first dies;

a circuit substrate, disposed under the first and second dies and electrically connected with the first die and second die;

a redistribution layer, disposed between the first and second dies and the circuit substrate, wherein the first dies and second die are disposed on a first side of the redistribution layer, and the redistribution layer is electrically connected with the first dies and the second die through connectors therebetween;

dummy bumps, disposed on the first side of the redistribution layer and spaced apart from the first dies and the second die, wherein the dummy bumps are electrically floating and unconnected with the first dies and the second die; and an underfill, disposed between the first dies, the second die and the redistribution layer and filled between a front side surface of the redistribution layer, the dummy bumps and the first dies and the second die; and wherein the underfill fully covers outer sidewalls of the first dies and outer sidewalls of the second die, and an extension height of the underfill measuring from the front side surface of the redistribution layer to a topmost point of the underfill is larger than the second height and about the same with the first height, and wherein the underfill extends outwardly from the outer sidewalls of the first dies and the second die to reach and cover the dummy bumps that are located outside vertical projections of the first dies and the second die.

19. The structure as claimed in claim 18, wherein dummy bumps include first round-shaped bumps located directly under the first dies, and second round-shaped bumps located between the first dies, and the underfill fully covers the first and second round-shaped bumps.

20. The structure as claimed in claim 19, wherein the second round-shaped bumps are smaller in sizes than those of the first round-shaped bumps.

* * * * *